(12) United States Patent
Mimura et al.

(10) Patent No.: US 6,700,643 B2
(45) Date of Patent: Mar. 2, 2004

(54) DEVICE FOR EXPOSURE OF A PERIPHERAL AREA OF A FILM CIRCUIT BOARD

(75) Inventors: Yoshiki Mimura, Yokohama (JP); Kazumoto Tochihara, Atugi (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 33 days.

(21) Appl. No.: 10/023,728

(22) Filed: Dec. 21, 2001

(65) Prior Publication Data

US 2002/0085191 A1 Jul. 4, 2002

(30) Foreign Application Priority Data

Dec. 22, 2000 (JP) ........................ 2000-390314

(51) Int. Cl.$^7$ .................. G03B 27/42; G03B 27/52
(52) U.S. Cl. .......................... 355/53; 355/30
(58) Field of Search ................ 355/30, 53, 67–71; 250/559.34, 559.36; 356/237.4

(56) References Cited

U.S. PATENT DOCUMENTS

| | | | |
|---|---|---|---|
| 4,801,352 A | * | 1/1989 | Piwczyk ................ 156/643 |
| 5,880,816 A | * | 3/1999 | Mimura et al. ........... 355/53 |
| 5,982,474 A | * | 11/1999 | Akiyama et al. .......... 355/53 |
| 6,004,631 A | * | 12/1999 | Mori ..................... 427/534 |

* cited by examiner

Primary Examiner—Henry Hung Nguyen
(74) Attorney, Agent, or Firm—Nixon Peabody LLP; David S. Safran (57) ABSTRACT

To expose the peripheral area of a film with high precision while the film is being transported, even if the peripheral area of the film has an arch or a fold, the edge of a copper foil on a TAB strip is determined by way of an optical detector which includes a light projection section and a light receiving section. The sliding base and the projection lens unit are moved such that the amount of light received by the light receiving part is constant. Ultraviolet light is concentrated on the peripheral area of the copper foil of the TAB strip, by which the peripheral area is exposed. The projection lens unit is provided with a nozzle from which air is blown onto the area of the TAB strip which is undergoing peripheral area exposure. This area is pressed by the pressure of the air against the surface of the carrier so that the peripheral area of the TAB strip can be made planar even if the strip has an arch or a fold. Thus, exposure can be performed with high precision without the mask edge image becoming blurred.

6 Claims, 7 Drawing Sheets

DEVICE FOR EXPOSURE OF A PERIPHERAL AREA OF A FILM CIRCUIT BOARD

BACKGROUND OF THE INVENTION

1. Field of the Invention

The invention relates to a device for exposure of a peripheral area, in which an unnecessary resist which has been applied to the peripheral area of a film circuit board, such as a TAB strip or the like, is exposed.

2. Description of Related Art

Figure 5A:
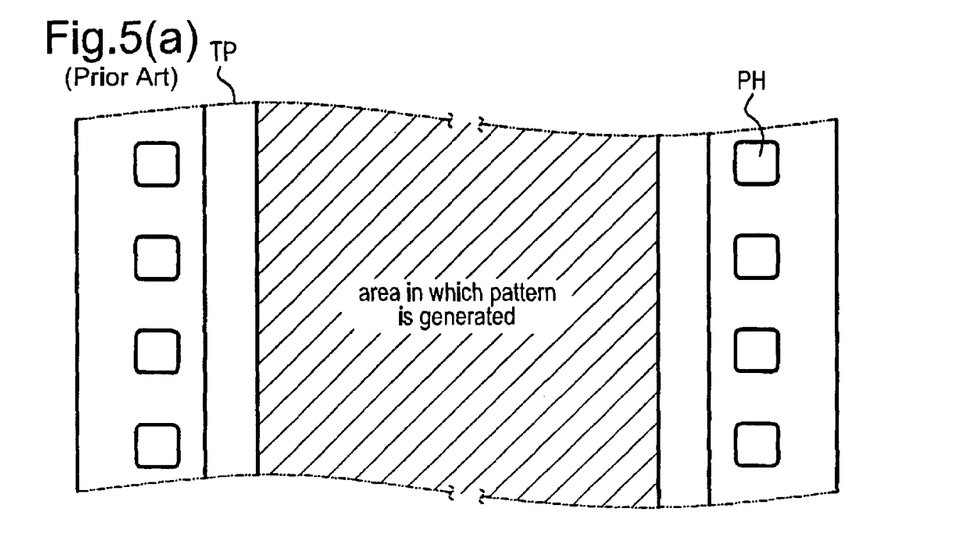

In a liquid crystal substrate, a cellular telephone, a camera, a calculator, an IC card or the like, a film circuit board is used in which an integrated circuit is applied to a polyester film, a polyimide film, or the like with a thickness of roughly 25 microns to 125 microns. FIG. 5(a) shows part of a TAB strip as one of the film circuit boards. The TAB strip TP is a strip workpiece with a width of 35 mm to 70 mm and a length of a few hundred millimeters and which is conventionally wound onto a reel.

A circuit is produced on the TAB strip TP by pressing a conductive foil (for example, a copper foil) to the above described insulating film and by repeating the following processes and the like. Applying a resist, performing an exposure process in which the desired circuit pattern is transferred, developing the resist, and performing etching process in which the unnecessary conductive foil is removed. In the given process, the film circuit board is unwound from a reel, treated and processed, and re-wound onto a reel.

The TAB strip TP (hereinafter also called a strip) is provided on both sides with perforation holes PH (also called sprocket holes) which have the same distance to one another (for example, with a pitch of 4.75 mm) and which are used for positioning and transporting the strip TP in the above described respective process. The strip TP is transported, for example, by rotating rollers having projections which are received into the perforation holes PH. Furthermore, in treatments such as exposure and the like, the strip TP is positioned by inserting pins located at given positions of the device into the perforation holes PH.

When performing the etching process, the unnecessary conductive foil (hereinafter also called copper foil Cu) is removed. If the conductive foil is not sufficiently removed, insulation faults and the like occur, and thus, scrap is formed. Furthermore, there is the disadvantage of a poor appearance.

Figure 5B:
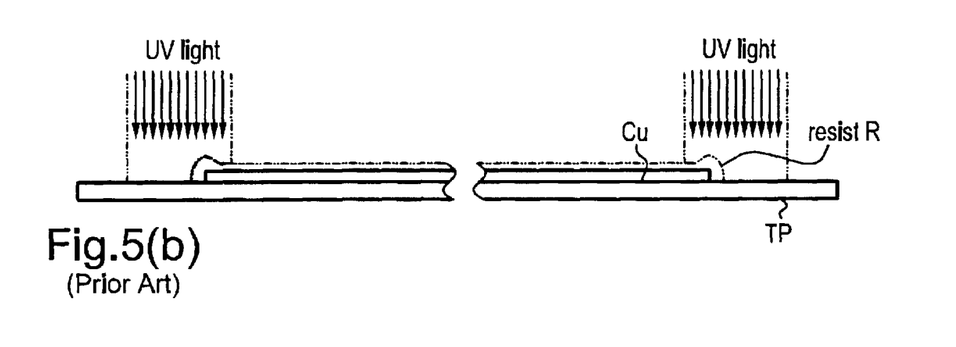

FIG. 5(b) is a cross sectional view of FIG. 5(a) and illustrates a state in which a resist R has been applied to the copper foil Cu of the TAB strip TP. As was described above, the copper foil Cu is pressed to an insulating film. On the edge of the copper foil (hereinafter also called the peripheral area), the applied resist R projects as a result of surface tension, thereby causing the edge to be thicker than the remaining area.

Conventionally a circuit pattern is formed such that a peripheral area of the copper foil Cu is avoided. The area in which a circuit pattern is formed is shown in FIG. 5 (a) as the "area in which the pattern is generated". Also, conventionally, the peripheral area of the copper foil Cu is removed in the etching process. However, since the resist R in the peripheral area of the copper foil is thick, a larger exposure amount than in the remaining area (i.e., the area in which the pattern is generated) is needed for complete exposure. In a one-time exposure (i.e., an exposure when the pattern is being generated), the exposure amount is insufficient, whereby upon development in the peripheral area not yet exposed, resist remains and in the etching process the copper foil is not removed.

Figure 6:
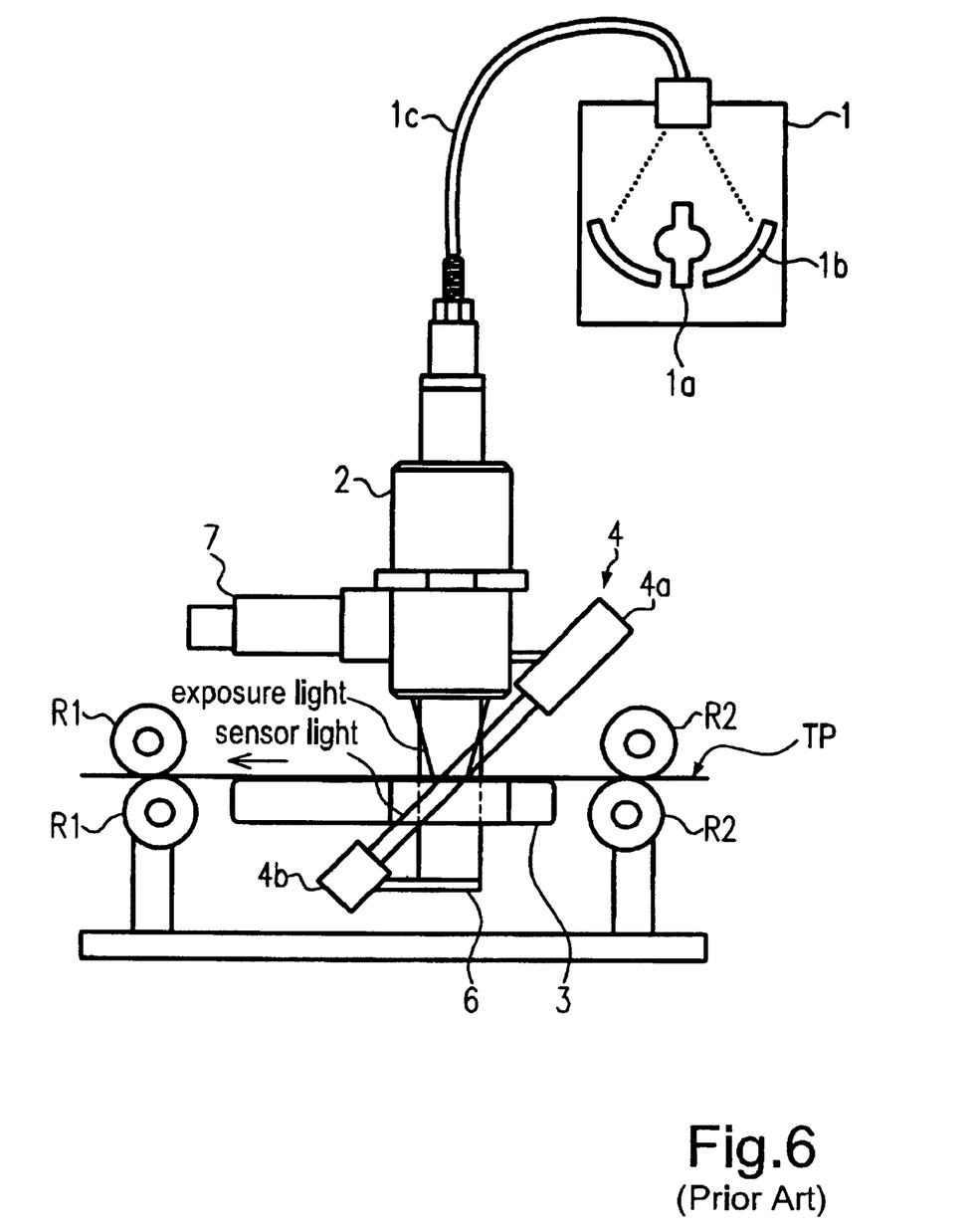
FIG. 6 shows a schematic view of an arrangement of a conventional device for exposing a peripheral area.
Figure 7:
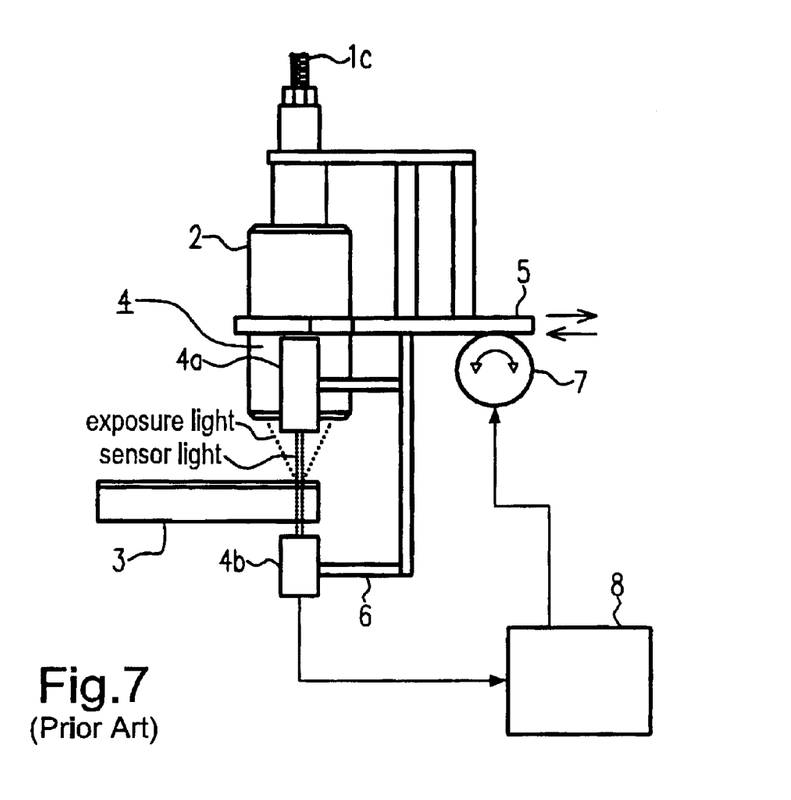
FIG. 7 shows a schematic view of an arrangement of the conventional device for exposing a peripheral area.

As shown in FIGS. 6 and 7, Japanese Patent Application JP 2000-187646, U.S. patent application Ser. No. 09/886005 and European Patent Application EP 01114566.1 each disclose a process for exposing the peripheral area in which only the resist in the peripheral area of the copper foil is exposed. FIG. 6 shows a device for exposing a peripheral area viewed from a direction which orthogonally intersects the transport direction of a film circuit board (hereinafter also called "TAB strip TP"). In FIG. 7, this device is viewed from a transport direction of a film circuit board. The device for exposure of a peripheral area is located at two points per strip, i.e., on both sides for one strip, and upstream of a device for developing the film circuit board, i.e., in the step before development. The TAB strip TP is continuously transported according to the development speed at 1.0 to 3.0 m/minute. During this transport, the resist is exposed in the peripheral area of the copper foil.

In FIGS. 6 and 7, the TAB strip TP is transported by delivery rollers R1 and R2 on a carrier 3 in a transport direction shown by the arrows in the drawings. An exposure light, such as ultraviolet light UV, for exposing the resist on the TAB strip TP is delivered by a light source part 1 which has a lamp 1a and a condenser mirror 1b through a quartz optical fiber 1c via a mask (not shown) which partially screens the exposure light. A projection lens unit 2 condenses the exposure light on the peripheral area of the copper foil of the TAB strip TP located on the carrier 3. Accordingly, the exposure light irradiation area is formed specifically by the mask and is projected by the projection lens unit 2 on the TAB strip TP. The edge of the copper foil pressed to the TAB strip TP is determined by an optical detector 4 which includes a projection part 4a which transmits a sensor light and a light receiving part 4b. The sensor light which emerges from the projection part 4a is received by the edge part of the copper foil and a gap located in the carrier 3 by the light receiving part 4b.

The optical detector 4 can be, for example, a parallel light linear sensor with a semiconductor laser. The sensor light emitted by the projection part 4a of the parallel-light linear sensor (i.e., nonexposure light) is laser light and propagates well in a straight line. When projected perpendicular relative to a flat body, the light becomes strip-shaped. The light receiving part 4b can completely receive the light from the projection part 4a at a given distance and furthermore can determine the change in the amount of light received.

The projection part 4a and the light receiving part 4b of the optical detector 4 are installed in a component 6 which, in turn, is installed in a sliding base 5 driven by a drive motor 7 in a direction which orthogonally intersects the transport direction of the TAB strip TP. The projection lens unit 2 is also installed in the sliding base 5. Thus, when the sliding base 5 is moved by the drive motor 7 in the direction of the arrow in FIG. 7, the projection lens unit 2 and the optical detector 4 also move accordingly in the same direction.

In FIG. 7, a controller 8 is provided into which a signal is input with a magnitude which corresponds to the intensity of the light received by the light receiving part 4b of the optical detector 4 (i.e., the amount of light received). The controller 8 drives the drive motor 7, and thus, moves the optical detector 4 and the sliding base 5 such that the above described amount of light received is always constant. Since an exit part (containing the projection lens), which encompasses the projection lens unit 2 and from which the peripheral area exposure light emerges, is installed in the sliding base 5, the position of the irradiation area of the exposure light emitted by the above described exit part is changed by the sliding base 5 moving. In other words, the optical detector 4 moves such that the amount of light received is always constant. The exposure light irradiation area moves to the same degree and in the same direction as the amount of motion of the sensor and its direction of motion in the direction which orthogonally intersects the transport direction of the TAB strip TP.

Figure 8:
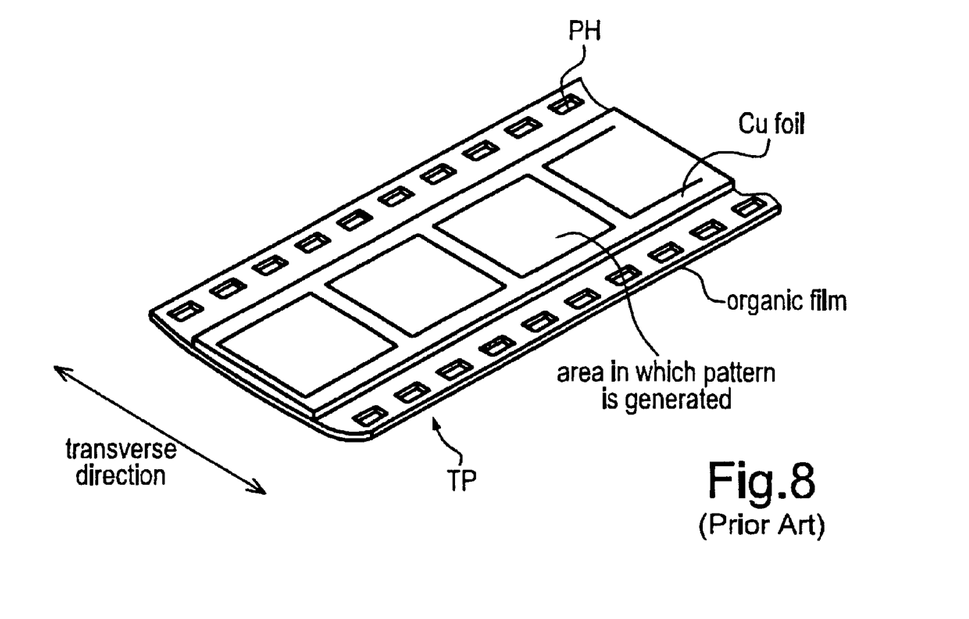
FIG. 8 shows a schematic view of a state in which the peripheral area of a TAB strip has an arch.

As shown in FIG. 8, the film circuit board, i.e., the TAB strip TP, is formed by pressing a copper foil onto a film which is an organic compound. Since the copper foil is pressed by application of heat and pressure, an arch may be formed as a result of the different thermal expansion coefficients between the copper foil and the film or for similar reasons, after pressing in the transverse direction of the strip. Furthermore, for a TAB strip TP with perforation holes, a fold may be formed in the strip peripheral area which is provided with perforation holes as a result of expansion and deformation if, in the previous process, the TAB strip is transported by a sprocket roller which engages the perforation holes.

If an arch and/or a fold is formed in the peripheral area of the strip, as shown in FIG. 8, when the resist of this peripheral area is exposed, the position of the strip peripheral area to be exposed relative to the focal position of the exposure light through to the projection lens of the device for exposing a peripheral area deviates in the direction of the optical axis of the emitted exposure light. Thus, the mask edge image projected onto the strip peripheral area becomes blurred, by which the exposure accuracy is reduced.

In order to prevent this, it is advantageous to improve the film circuit board into a flat film circuit board. In such a case, however, the following conditions must be met. First, the area just irradiated with exposure light during exposure of the peripheral area must be improved. In other words, because the evenness of the just-exposed area is not improved even if the vicinity of the irradiation area is improved greatly, the exposure light must be able to penetrate the pressing means. Secondly, the arch and a fold in the peripheral area of the TAB strip TP must be corrected while the TAB strip TP is being transported with a certain conventional speed. The device for exposure of the peripheral area is installed in a development apparatus which transports and develops the strip with a certain speed. When the transport of the strips is stopped temporarily or the transport speed is reduced to press the strip, therefore, different conditions for development must be changed. Furthermore, the throughput also decreases.

SUMMARY OF THE INVENTION

The primary object of the invention is to eliminate the above described disadvantages in the prior art in meeting the above described conditions in a device for exposure of a peripheral area of a film circuit board, and to be able to expose the peripheral area of the film with high precision even if the peripheral area of the film has an arch or a fold.

The object is achieved in accordance with the invention by providing a device for exposing the peripheral area of a film circuit board which includes a means for edge determination of the film circuit board including an optical detector having a light projection section for transmitting or projecting sensor light, and a light receiving part for receiving the sensor light, and a controller in electronic communication with the means for edge determination, the controller operating, based upon the output received from the means for edge determination, moves the area irradiated with the exposure light and the above described film circuit board in a relative manner. The controller also executes control such that the peripheral area of the film circuit board is irradiated with exposure light. A gas, for example, air, is discharged or blown into the area of the film circuit board which is subjected to peripheral area exposure and this area is pressed against a carrier with good evenness which is located on the bottom surface the film circuit board. Since the film circuit board is transported while being pressed by the gas against the above described carrier, the carrier is processed such that it acquires good evenness and the bottom surface of the film circuit board is prevented from being scratched during transport.

Preferably, the carrier against which the film is pressed is made of a material which transmits or reflects the sensor light so that the light receiving sensor of the means for edge determination receives the sensor light from the projection sensor.

Because a gas is blown on the film circuit board, an arch and a fold of the film circuit board in the area irradiated with exposure light is corrected without screening the exposure light while the film circuit board is transported.

Furthermore, pressing prevents the surface of the film circuit board from being scratched. By processing the carrier surface such that it acquires good evenness, scratching of the back of the strip can be prevented.

The invention is further described below using several embodiments shown in the drawings.

BRIEF DESCRIPTION OF THE DRAWINGS

FIGS. 2(*a*) and 2(*b*) each show a schematic view of the arrangement of the device for exposing the peripheral area in accordance with a first embodiment of the invention;

FIGS. 5(*a*) and 5(*b*) each show a schematic view of a state in which a resist has been applied to part of a film circuit boards such as a TAB strip and to a copper foil;

DETAILED DESCRIPTION OF THE INVENTION

Figure 1:
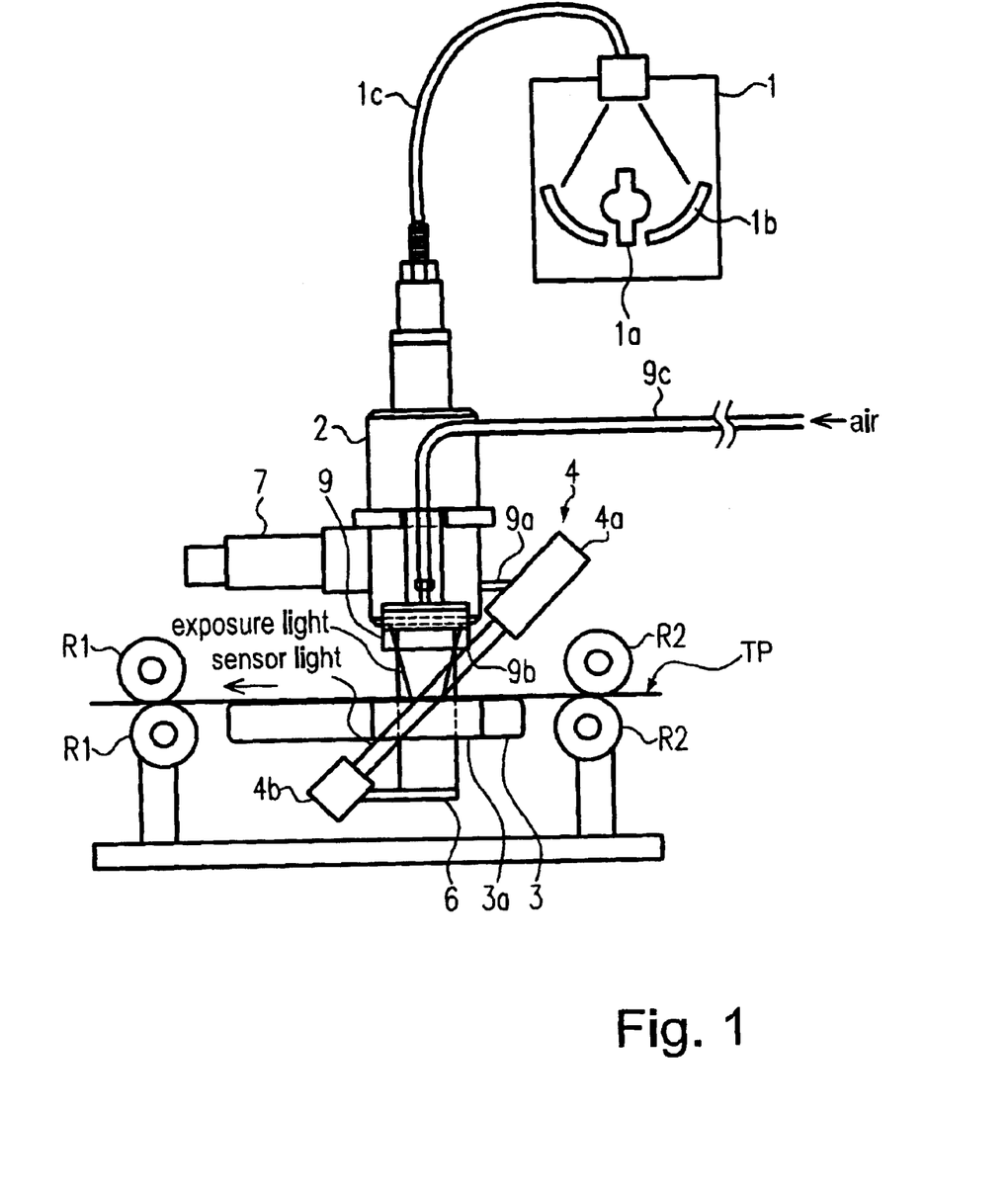
FIG. 1 shows a schematic view of an arrangement of a device for exposing the peripheral area in accordance with a first embodiment of the invention.
Figure 2A:
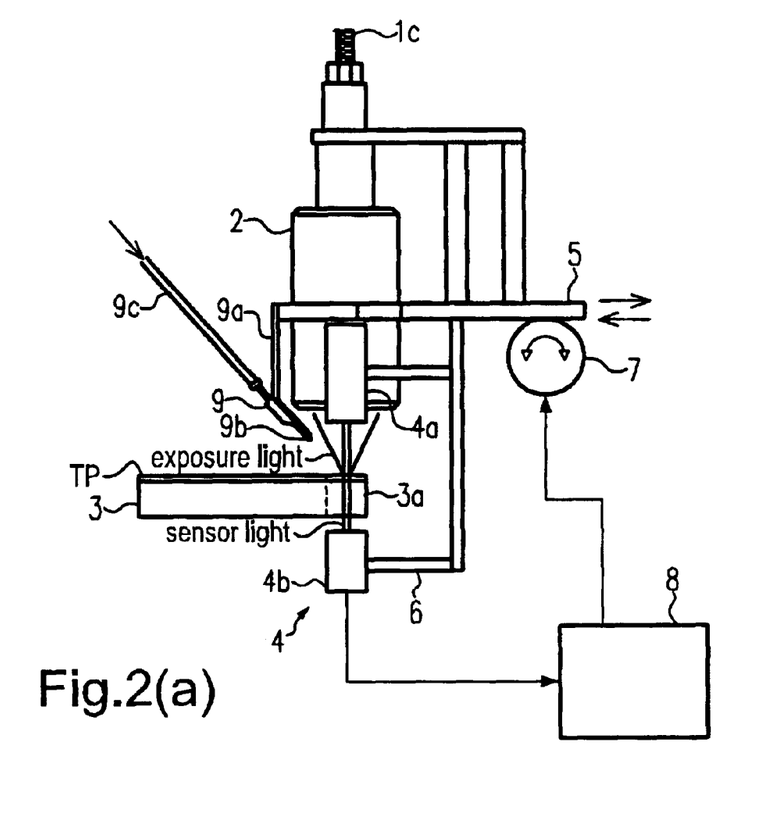
Figure 2B:
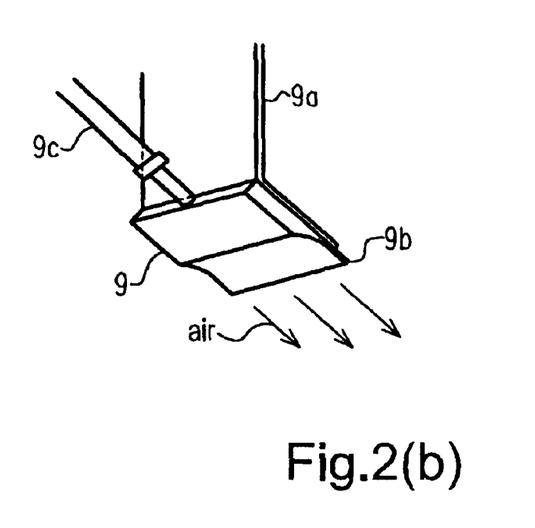

FIGS. 1, 2(*a*) and 2(*b*) show an arrangement of a device for exposing a peripheral area in accordance with one embodiment of the invention. In FIG. 1, the device for exposing a peripheral area is viewed from a direction which orthogonally intersects the transport direction of a film circuit board. In FIG. 2(*a*), the device is viewed from a transport direction of the film circuit board. The same parts in FIGS. 1 and 2(a) and 2(b) are provided with the same reference numbers as in FIGS. 6 and 7. While the invention will be described for a situation in which a TAB strip TP is used as the film circuit board, the invention can also be used for a film circuit board without perforation holes.

In FIGS. 1, 2(a) and 2(b), an exposure light for exposing a resist on the TAB strip TP is delivered by a light source part 1 which has a lamp 1a and a condenser mirror 1b by way of a quartz optical fiber 1c via a mask (not shown) to a projection lens unit 2, as was previously described. The projection lens unit 2 condenses the exposure light, such as ultraviolet light, which has been partially screened by the above described mask on the peripheral area of the copper foil of the TAB strip TP on the carrier 3. The edge of the copper foil, which is pressed to the TAB strip TP, is determined by an optical detector 4 which includes a light projection section 4a for transmitting or projecting sensor light, and a light receiving section 4b for receiving the sensor light.

Figure 3:
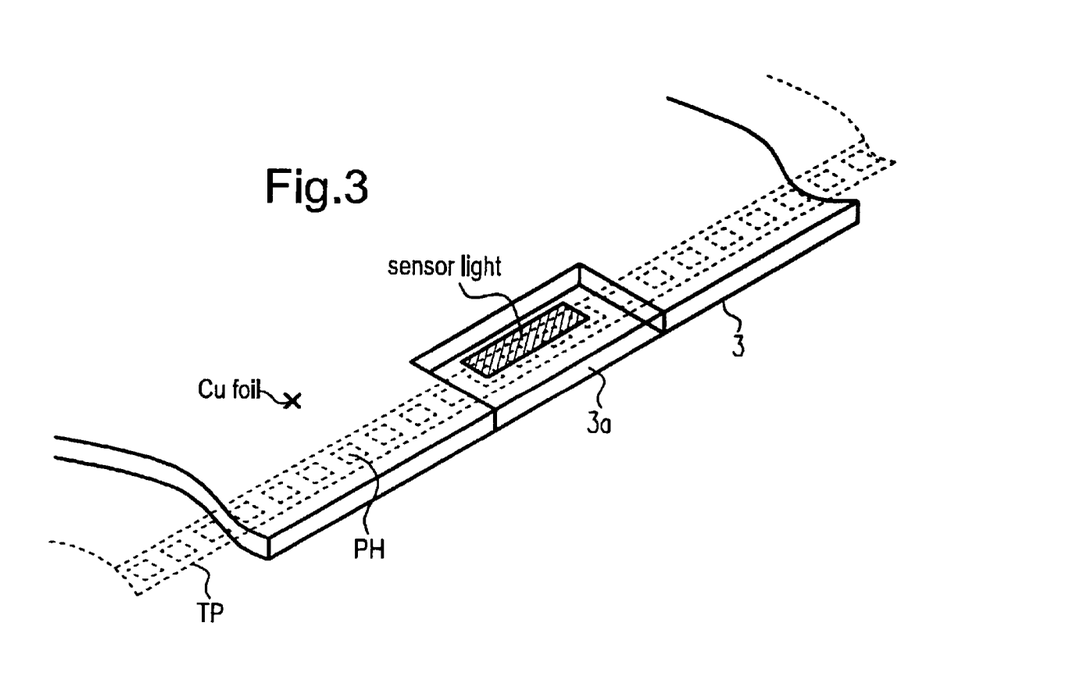
FIG. 3 shows a schematic view of a quartz plate located on a carrier in the first embodiment of the invention.

As shown in FIG. 3, in the area of the carrier 3 irradiated with sensor light from the projection part 4a, the carrier 3 is provided with a quartz plate 3a. The sensor light is projected on the TAB strip TP (shown in the drawings using a broken line) and the carrier 3, which is a quartz plate 3a, and is received via the peripheral area of the TAB strip TP and the quartz plate 3a by the light receiving part 4b which is located underneath the carrier 3. Furthermore, instead of the above described quartz plate 3a, another transparent part which is not degraded by exposure light, such as acrylic or the like, can also be used. The optical detector 4 can be for example a parallel light linear sensor with a semiconductor laser, as was above described.

As shown in FIGS. 1, 2(a) and 2(b), the projection part 4a and the light receiving part 4b of the optical detector 4 are installed in a component 6 for the optical detector. The component 6 is, in turn, installed in a sliding base 5 which is driven by a drive motor 7 in the direction of the arrows in FIG. 2(a) (i.e., in the direction which orthogonally intersects the transport direction of the TAB strip TP). The projection lens unit 2 is also installed in the sliding base 5. Thus, when the sliding base 5 is moved by the drive motor 7 in the direction of the arrows in FIG. 2(a), the projection lens unit 2 and the optical detector 4 also move accordingly in the same direction.

As depicted in FIG. 2(a), a controller 8 is provided, into which a signal is input with a magnitude which corresponds to the intensity of the light received by the light receiving part 4b of the optical detector 4 (i.e., the amount of light received). The controller 8 drives the drive motor 7, thus, also moves the optical detector 4 and the sliding base 5 such that the amount of light received is always constant. Since an exit part (containing the projection lens) which includes the projection lens unit 2 and from which the peripheral area exposure light emerges, is installed in the sliding base 5, the position of the irradiation area of the exposure light emitted by the exit part is changed by the movement of the sliding base 5. In other words, the optical detector 4 moves such that the amount of light received is always constant. The exposure light exit part, i.e., the exposure light irradiation area, moves to the same degree and in the same direction as the amount of motion of the sensor and its direction of motion in the direction which orthogonally intersects the transport direction of the TAB strip TP.

A nozzle 9, in which a gas such as air having a pressure of 200 kPa to 300 kPa is installed in the projection lens unit 2 via a mounting component 9a. The air is discharged or blown on the area of the TAB strip TP which is subjected to peripheral area exposure from the inside in the direction to the outside of the strip TP. An air discharge opening 9b of the nozzle 9 which, as is shown in FIG. 2(b), is a slot-like opening which is made long according to the shape of the area irradiated with the peripheral area exposure light in the transport direction of the TAB strip TP and narrow in the direction which orthogonally intersects this direction. By blowing the air out of the air discharge opening 9b in the oblique direction from the inside in the direction to the outside of the TAB strip TP, the air blown out by this air discharge opening 9b is spread over the entire area which is irradiated with the peripheral area exposure light. The peripheral area of the TAB strip TP in which an arch or a fold has formed is pressed by the pressure of air against the surface of the carrier 3.

As was described above, the quartz plate 3a is installed in the vicinity of the carrier 3 through which the sensor light penetrates. When this quartz plate 3a and the surface of the carrier 3 in the vicinity of the latter has been worked such that good evenness is achieved, the peripheral area of the TAB strip TP becomes plane according to the surface of the carrier 3, even if the TAB strip TP had an arch or a fold beforehand. Therefore, exposure can be done with high precision without the edge image of the mask becoming blurred by the surface of the carrier 3 being brought into the focus position of the exposure light.

In the first embodiment, the means for correcting the arch or the fold of the TAB strip TP is a gas such as air. Therefore, the gas (i.e., air) is blown onto the area of the TAB strip TP which is irradiated with exposure light without screening the exposure light, and thus, the boundary area of the TAB strip can be reliably brought into agreement with the focus position of the exposure light. Furthermore, the TAB strip TP can be transported while the arch or the fold is being corrected. In addition, the pressing prevents the surface of the TAB strip TP from being scratched. Damage to the back of the strip TP can be prevented by the working of the surface of the printed carrier 3 such that it has good evenness.

In the device for exposure of a peripheral area, the edge of the copper foil pressed onto the TAB strip TP is determined by an optical detector which includes the projection part 4a located above the carrier 3 and the light receiving part 4b located underneath the carrier 3. It is therefore necessary, as was shown in FIG. 3, for the carrier material in the area irradiated with sensor light to be composed of a material that is transparent to sensor light, such as glass, acrylic, or the like. One embodiment is shown below in which instead of a component which is transparent to sensor light, a mirror is used in the area of the carrier 3 and the sensor light is projected thereon.

Figure 4:
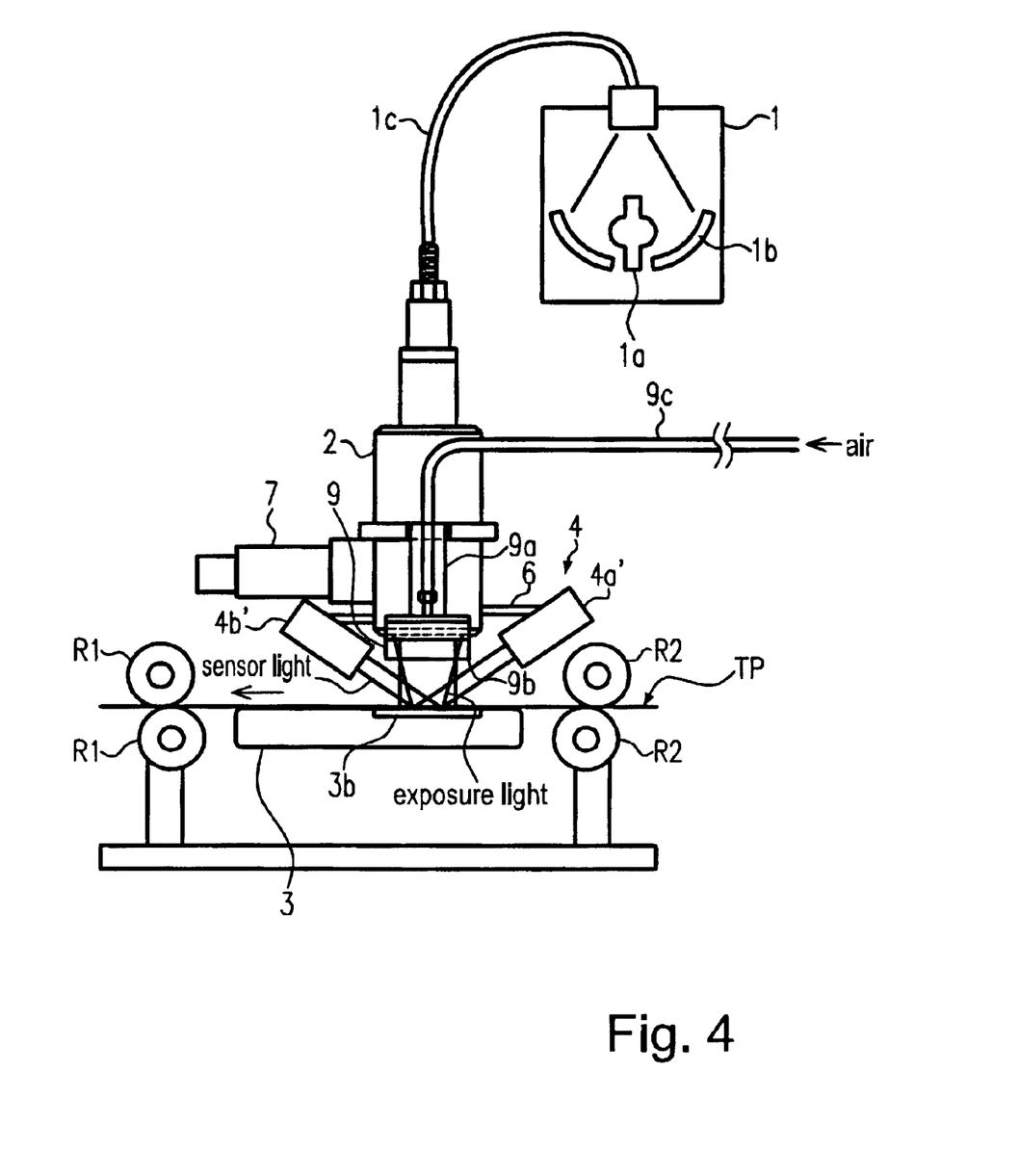
FIG. 4 shows a schematic view of an arrangement of a device for exposing the peripheral area in accordance with a second embodiment of the invention.

FIG. 4 shows a second embodiment of the invention in which, in the area irradiated with sensor light, a mirror is used. In FIG. 4, the device for exposure of a peripheral area is viewed from the direction which orthogonally intersects the transport direction of a film circuit board. The same parts as in FIG. 4 are provided with the same reference numbers as in FIGS. 1, 2(a) and 2(b).

The arrangement and the operation of the device for exposure of a peripheral area in this embodiment are identical to those in FIGS. 1, 2(a) and 2(b). However, in this embodiment, in the area irradiated with the sensor light, a mirror is used and the light receiving part 4b of the edge determination sensor is located above the carrier 3. In FIG. 4, the edge of the copper foil pressed onto the TAB strip TP is determined by an optical detector 4 which includes a projection part 4a' and a light receiving part 4b' which are located above the carrier 3.

The area irradiated with the sensor light from the projection part 4a' of the carrier 3 is provided with a mirror 3b. The sensor light from the projection part 4a' is projected onto the TAB strip TP in the area of the mirror 3b, reflected by the mirror 3b and the surface of the TAB strip TP and received by the light receiving part 4b'. Since the surface of the TAB strip TP and the surface of the mirror 3b have different reflectance factors for the sensor light, using this difference of the reflectance factor the edge of the copper foil of the TAB strip TP can be determined, as in the above described first embodiment.

As in the first embodiment, the projection part 4a' and the light receiving part 4b' of the optical detector 4 are installed in a sliding base (not shown). The sliding base and the projection lens unit 2 are driven by a drive motor. As was previously described, a signal is input into a controller (not shown) with a magnitude which corresponds to the intensity of the light received by the light receiving part 4b' of the optical detector 4 (amount of light received). The controller moves the sliding base and the projection lens unit 2 such that the amount of light received is always constant. The position of the area irradiated with the exposure light is thus changed, and the UV light is concentrated onto the boundary area of the copper foil of the TAB strip TP and the peripheral area exposed.

As was previously described, a nozzle 9 is installed in the above described projection lens unit 2. A gas such as air is discharged from the nozzle onto the area of the TAB strip TP which is being subjected to boundary area exposure. This area is pressed by the pressure of air against the surface of the carrier 3. In this way, the peripheral area of the TAB strip TP can be made plane even if the peripheral area of the film had an arch or a fold beforehand, as in the first embodiment.

In the second embodiment, when the projection lens unit 2 is moved, the area irradiated with the exposure light and the film circuit board are moved accordingly. However, the mask can also be moved accordingly, where in such a case, the direction of motion of the mask and the direction of motion of the optical detector 4 must be opposite one another. Furthermore, the carrier 3 can move, and thus, the area irradiated with the exposure light and the above described film circuit board can move in a relative manner.

As was previously described, the following actions can be obtained in accordance with the invention. First, the position of the film subjected to peripheral area exposure does not deviate from the focus position of the exposure light (direction of the optical axis of the exposure light with which the peripheral area is exposed). In this way, the mask edge image is projected onto the film peripheral area without becoming blurred, by which exposure can be done with high accuracy.

Secondly, the film circuit board can be transported while an arch or a fold is being corrected. Furthermore, the peripheral area can be exposed without changing the conventional film transport speed. It is, therefore, unnecessary to change the development conditions of the development apparatus. In addition a decrease of throughput can be prevented.

Thirdly, the edge of the copper foil in the area subjected to peripheral area exposure can be determined by the edge determination means which includes an optical detector by the measure that the area of the carrier against which the film circuit board is pressed is formed from a component which is penetrated by sensor light or which reflects the sensor light. Therefore, the peripheral area can be exposed with high precision according to this edge.

What is claimed is:

1. Device for exposing a peripheral area of a film circuit board by transporting the film circuit board in a transport direction and irradiating a resist on a peripheral area of the film circuit board with exposure light from a light irradiation means, the device comprising:

means for determining the location of an edge of the film circuit board including an optical detector having a light projection section for transmitting a sensor light to the film circuit board and a light receiving part for receiving the sensor light from said light projection section;

a controller for moving the film circuit board so that the resist on the peripheral area of the film circuit board is irradiated with exposure light, moving of the film circuit board being based upon data received from said means for determining;

gas discharge means for discharging a gas on the peripheral area in a manner for flattening and maintaining said film circuit board planar, said gas being discharged on the peripheral area as the peripheral area is irradiated with exposure light; and a carrier for supporting the film circuit board, said carrier being composed of a material adapted to transmit sensor light to a bottom surface of the peripheral area.

2. Device for exposure of a peripheral area of a film circuit board as claimed in claim 1, wherein said gas discharge means is a slot-shaped nozzle with lengthwise sides which are located parallel to a longitudinal side of the film circuit board.

3. Device for exposure of a peripheral area of a film circuit board as claimed in claim 2, wherein said slot-shaped nozzle is arranged such that the gas strikes the peripheral area of the film circuit board obliquely and the gas flows from inside of the peripheral area to an outer edge of the film circuit board.

4. Device for exposing a peripheral area of a film circuit board by transporting the film circuit board in a transport direction and irradiating a resist in a peripheral area of the film circuit board with exposure light from a light irradiation means, the device comprising:

means for determining the location of an edge of the film circuit board including an optical detector having a light projection section for transmitting a sensor light to the film circuit board and a light receiving part for receiving the sensor light from said light projection section;

a controller for moving the film circuit board so that the resist on the peripheral area of the film circuit board is irradiated with exposure light, moving of the film circuit board being based upon data received from said means for determining;

gas discharge means for discharging a gas on the peripheral area in a manner for flattening and maintaining said film circuit board planar, said gas being discharged on the peripheral area as the peripheral area is irradiated with exposure light; and a carrier for supporting the film circuit board, said carrier being composed of a material adapted to reflect sensor light in the peripheral area.

5. Device for exposure of a peripheral area of a film circuit board as claimed in claim 4, wherein the gas discharge means is a slot-shaped nozzle with longitudinal sides which are located parallel to a longitudinal side of the film circuit board.

6. Device for exposure of a peripheral area of a film circuit board as claimed in claim 5, wherein the slot-shaped nozzle is arranged such that gas strikes the peripheral area of the film circuit board obliquely and the gas flows from inside of the peripheral area to an outer edge of the film circuit board.

* * * * *